(12) United States Patent
Terada et al.

(10) Patent No.: US 8,338,798 B2
(45) Date of Patent: Dec. 25, 2012

(54) SAMPLE HOLDER FOR ELECTRON MICROSCOPE

(75) Inventors: Shohei Terada, Hitachinaka (JP); Tatsumi Hirano, Hitachinaka (JP)

(73) Assignee: Hitachi, Ltd., Tokyo (JP)

(*) Notice: Subject to any disclaimer, the term of this patent is extended or adjusted under 35 U.S.C. 154(b) by 233 days.

(21) Appl. No.: 12/817,725

(22) Filed: Jun. 17, 2010

(65) Prior Publication Data

US 2010/0320396 A1    Dec. 23, 2010

(30) Foreign Application Priority Data

Jun. 18, 2009  (JP) .................................. 2009-144874

(51) Int. Cl.
  *H01J 37/20*   (2006.01)
(52) U.S. Cl. .............. 250/440.11; 250/310; 250/441.11; 250/442.11
(58) Field of Classification Search ............. 250/440.11, 250/441.11, 442.11, 310
  See application file for complete search history.

(56) References Cited

U.S. PATENT DOCUMENTS

| | | | | |
|---|---|---|---|---|
| 3,896,314 A * | 7/1975 | Nukui et al. | ............. | 250/442.11 |
| 5,270,643 A * | 12/1993 | Richardson et al. | ...... | 324/754.22 |
| 5,455,420 A * | 10/1995 | Ho et al. | ........................... | 850/1 |
| 5,476,357 A | 12/1995 | Arai | | |
| 5,510,615 A * | 4/1996 | Ho et al. | ........................... | 850/9 |
| 5,621,210 A * | 4/1997 | Lindsay | ........................... | 850/14 |
| 5,750,989 A * | 5/1998 | Lindsay et al. | .................. | 850/14 |
| 6,744,268 B2 * | 6/2004 | Hollman | ................... | 324/750.14 |
| 6,967,335 B1 * | 11/2005 | Dyer et al. | ................ | 250/442.11 |
| 7,041,985 B1 * | 5/2006 | Wang et al. | ................ | 250/442.11 |
| 7,230,242 B2 * | 6/2007 | Behar et al. | .................... | 250/310 |
| 7,232,688 B2 * | 6/2007 | Little et al. | ..................... | 436/173 |
| 7,253,408 B2 | 8/2007 | West | ............................. | 250/309 |
| 7,504,623 B2 * | 3/2009 | Fischione et al. | ............. | 250/309 |
| 7,566,884 B2 * | 7/2009 | Deguchi et al. | .......... | 250/442.11 |
| 7,573,031 B2 * | 8/2009 | Behar et al. | .................... | 250/310 |
| 7,700,927 B2 * | 4/2010 | Nagakubo et al. | ......... | 250/443.1 |
| 8,101,924 B2 * | 1/2012 | Hamochi | ................. | 250/442.11 |
| 2005/0061971 A1 * | 3/2005 | Terada et al. | ................. | 250/307 |
| 2006/0289784 A1 * | 12/2006 | Deguchi et al. | .......... | 250/441.11 |
| 2007/0210253 A1 * | 9/2007 | Behar et al. | ................... | 250/311 |
| 2007/0252091 A1 * | 11/2007 | Terada et al. | ........... | 250/442.11 |
| 2009/0302234 A1 * | 12/2009 | Terada et al. | ........... | 250/442.11 |
| 2010/0320396 A1 * | 12/2010 | Terada et al. | ........... | 250/441.11 |

FOREIGN PATENT DOCUMENTS

JP         1-129106       5/1989

(Continued)

OTHER PUBLICATIONS

Japanese Office Action, w/ partial English translation thereof, issued in Japanese Patent Application No. 2009-144874, dated Oct. 4, 2011.

*Primary Examiner* — David A Vanore
(74) *Attorney, Agent, or Firm* — McDermott Will & Emery LLP

(57) ABSTRACT

A sample holder capable of holding samples is provided which comprises
  a plurality of probes in contact with a sample, fine movement mechanisms for moving the plural probes, and a driver connected to the fine movement mechanisms, wherein the plural fine movement mechanisms move the plural probes independently of one another and the driver moves the plural probes simultaneously.

20 Claims, 4 Drawing Sheets

FOREIGN PATENT DOCUMENTS

| | | |
|---|---|---|
| JP | 6-328374 | 11/1994 |
| JP | 8-132363 | 5/1996 |
| JP | 2002-103298 | 4/2002 |
| JP | 2003-035682 | 2/2003 |
| JP | 2004-358601 | 12/2004 |
| JP | 2005-091199 | 4/2005 |
| JP | 2006-331979 | 12/2006 |
| JP | 2007-255933 | 10/2007 |
| JP | 2007-273489 | 10/2007 |

* cited by examiner

⊗ DIRECTION OF INCIDENCE OF ELECTRON BEAM

SAMPLE HOLDER FOR ELECTRON MICROSCOPE

BACKGROUND OF THE INVENTION

The present invention relates to a sample holder for electron microscope and more particularly, to an apparatus which can make possible electrical measurement of a desired inward position of a sample inside a transmission electron microscope and a scanning transmission electron microscope as well and at the same time, can enable electron microscopic observation of the portion undergoing electrical measurement to be achieved.

With fine machining dimension and high integration of a semiconductor device, a magnetic device and the like advanced, deterioration in device characteristics and degradation in reliability have become problematic more seriously than before. In recent years, for the sake of analyzing faults in an nanometer area in a semiconductor device to ascertain an essential cause of a fault in the course of development and mass production of a new process, such expedients as spectroscopic analysis and two-dimensional element distribution analysis have become indispensable which use (scanning) transmission electron microscopy ((STEM), electron energy loss spectroscopy (EELS) and energy dispersive X-ray spectroscopy (EDX).

Conventionally, in evaluating characteristics of the device, a probe for measurement of electrical characteristics is brought into contact with terminal portions disposed on the device, a portion determined faulty as a result of electrical measurement is extracted with a focused ion beam unit and thereafter, high resolution observation and element analysis of the faulty portion are carried out by means of a (scanning) transmission electron microscope and a concomitant analysis units, thereby ascertaining causes of faults.

In the above method, however, a portion first determined faulty is observed subsequently with an electron microscope and so electron microscopic observation cannot be conducted concurrently with measurement of electrical characteristics. To cope with this problem, an on-the-spot observation technique has been disclosed in, for example, JPA-2005-091199 (Patent Document 1), JP-A-2007-273489 (Patent Document 2), JP-A-2006-331979 (Patent Document 3) and JP-A-2003-035682 (Patent Document 4), according to which the electron microscopic observation is carried out while applying a voltage inside an electron microscope.

Patent Document 1 discloses an internal structure observation apparatus in which a probe provided inside an electron microscope is brought into contact with a sample located in the electron microscope by means of a probe movement control unit, a voltage is applied to an arbitrary portion of the sample and then, a change in internal structure of the sample caused by the voltage application is detected with a detector.

Patent Document 2 discloses a technique, according to which, in a sample holder for transmission electron microscope, a probe base mounted with a plurality of probes is provided, a sample for observation can be located on the sample holder body, a piezoelectric device is disposed which makes movable at least either the probe base or the sample and a probe is brought into contact with the sample to permit a voltage to be applied to an arbitrary inward portion of the sample.

Patent Document 3 discloses a sample holder for electron microscope, with which measurement points are selected from an observed image and measurement of electric resistance between at least two nearby points can be conducted. The sample holder is provided with at least two probes for current measurement which are adjustable in position in three axial directions inclusive of a direction of insertion of the sample holder and besides, a probe position precise adjustment mechanism is provided which can bring these probes into contact with desired inward positions of the sample.

Patent Document 4 discloses a technique, according to which in a process of machining an arbitrary region of an objective sample into minute sample pieces by using a charged particle beam and picking up sample pieces, a fine electric conductor is attached to a picked-up sample piece and a voltage is applied to the attached fine electric conductor.

According to the techniques disclosed in the Patent Documents, by applying voltage to a sample inside the electron microscope, internal electrical characteristics of the sample can be measured and besides electron microscopic observation of a location where the voltage is applied can be achieved.

In the internal structure observation apparatus disclosed in Patent Document 1, a probe is brought into contact with an inward portion of a sample provided inside the electron microscope and voltage is applied to the inward portion of the sample by way of the contacted probe. The probe is associated with a probe movement control unit for moving the probe, so that the probe can be moved to a desired position, contacted to the inward portion of the sample and electrical characteristics can be measured.

But, in the electron microscope, the sample location position is in a narrow space defined by magnetic pole pieces of an objective lens and in addition, a detector such as for EDX is also provided, with the result that the region around the sample is limited and it is difficult to move the probe freely from the periphery of the electron microscope to bring it into contact with the observation sample of the electron microscope.

Disclosed in Patent Documents 2, 3 and 4 is the technique according to which in a limited inner space of the electron microscope, a probe is provided inside the sample holder and the probe is brought into contact with an observation sample of the electron microscope.

In the case of Patent Document 2, however, at least two probes are disposed and the piezoelectric device for driving the probes is provided but the probes are all disposed on the probe base which is driven by the piezoelectric device, so that all probes are moved at a time. This makes it difficult to bring the probe into contact with a desired inward position of the sample.

In the case of Patent Document 3, with the view of moving at least two probes independently in three axial directions inclusive of the entry direction of the sample holder, linear movement mechanisms (micrometer heads) and piezoelectric devices are provided in individual axial directions of the individual probes.

But, when two probes are used, six linear movement mechanisms in total are necessary in the system of Patent Document 3 and consequently, the sample holder increases in weight on the side opposite to the side where the sample is located, thus increasing the influence of sample drift, for instance. Further, the piezoelectric device is remote from the probe for contact to the sample and therefore, when the piezoelectric devices are used for bringing the probe into contact with the sample, individual differences of the piezoelectric devices need to be taken sufficiently into consideration.

Further, in the case of the sample holder of Patent Document 3, the interior of the sample holder is placed in vacuum condition and so an O ring is interposed between the outer cylinder of the holder and a support member for the linear movement mechanism. Accordingly, the region to be maintained in vacuum is widened and in the electron microscope used in high vacuum, time for pumping to vacuum is caused to be prolonged in the event of deterioration of the vacuum degree inside the electron microscope proper or upon mount/dismount of a sample.

In Patent Document 4, a desired sample in a device is extracted with a focused ion beam unit and an electric conductor is fixed to part of the sample by using beam assist deposition. Thereafter, the sample is admitted to the inside of the electron microscope, with the result that electrical characteristics of the portion fixedly mounted with the electric conductor can be measured and the electron microscopic observation can be achieved but electrical characteristics identification and electron microscopic observation cannot be achieved at portions other than the portion fixedly mounted with the electric conductor.

SUMMARY OF THE INVENTION

In the light of the above problems, the present invention has for its object to provide an apparatus which has a plurality of probes and can perform electric measurement of an arbitrary portion of an electron microscope sample and electron microscopic observation at a time on the basis of the probes. Especially, it is an object of the present invention to provide an apparatus which can move the plural probes independently of one another with lightweight mechanisms even in a narrow vacuum-maintained space inside the electron microscope in which the region around the sample is limited.

To solve the above problems, according to the present invention, a sample holder capable of holding samples is provided which comprises a plurality of probes in contact with a sample, a plurality of fine movement mechanisms for moving the plural probes and a driver connected to the fine movement mechanisms, wherein the plural probe fine movement mechanisms move the plural probes independently of one another and the driver moves the plural probes simultaneously.

Further, a sample holder capable of holding samples is provided which comprises a plurality of probes in contact with a sample, a first fine movement mechanism for moving at least one of the plural probes independently of the other probes, a driver connected to the first fine movement mechanism, and a second fine movement mechanism for moving the driver, wherein the driver moves the plural probes simultaneously.

The sample holder according to the present invention has a plurality of probes connected to an electrical measurement unit and the plural probes can be moved by means of the driver and the fine movement mechanisms. Since the plural probes are moveable independently of one another, an arbitrary portion of an electron microscopic sample can be selected inside an electron microscope and the selected portion can be measured electrically and at the same time the electron microscopic observation of the electrically measured portion can achieved. Further, the plural probes are moved simultaneously by means of the single driver and the fine movement mechanisms for moving the probes are provided separately from the driver, so that the sample holder can be provided in which while keeping the side of the sample holder opposite to the sample location portion side light in weight, the plural probes can be moved independently by means of the fine mechanisms.

Other objects, features and advantages of the invention will become apparent from the following description of the embodiments of the invention taken in conjunction with the accompanying drawings.

DETAILED DESCRIPTION OF THE INVENTION

Figure 1:
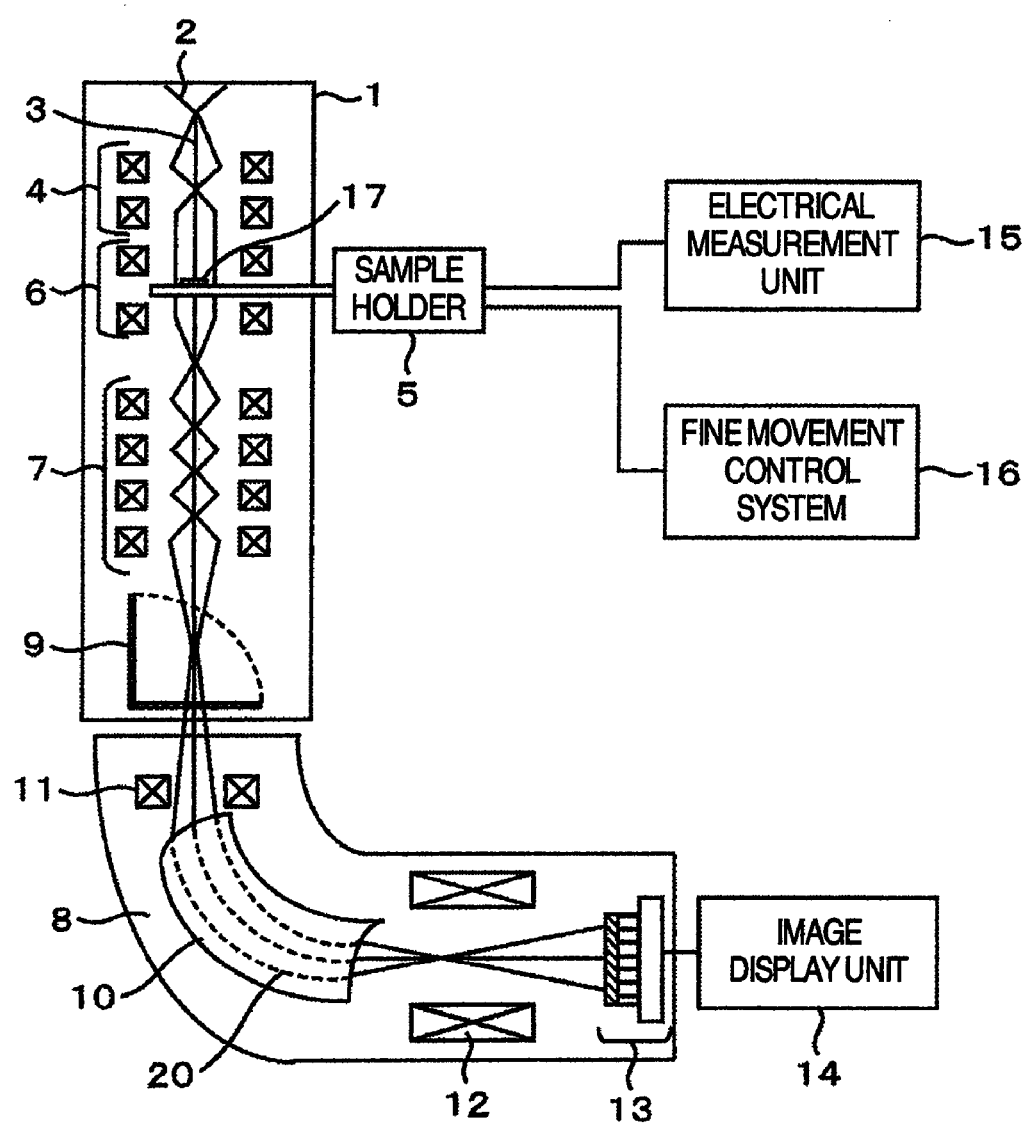
FIG. 1 is a diagram schematically showing an example of the construction of a transmission electron microscope with electron energy loss spectrometer.

An embodiment of the present invention will now be described in greater detail with reference to the accompanying drawings. In all drawings for explaining the embodiments, like member is designated by like reference numeral and its reiterative explanation will be omitted.

Referring first to FIG. 1, there is illustrated a diagram schematically showing the construction by way of example of a state in which a sample holder 5 of the invention is inserted into the interior of a transmission electron microscope mounted with electron energy loss spectrometer according to an embodiment of the invention.

In FIG. 1, the transmission electron microscope mounted with an electron energy loss spectrometer having the sample holder 5 inserted comprises a transmission electron microscope 1, an electron energy loss spectrometer 8 and an image display unit 14. Provided for the transmission electron microscope 1 are an electron source 2 for emitting an electron beam 3, a condenser lens 4, an objective lens 6, an image forming lens system 7 and a fluorescent screen 9. The tip end, mounted with a sample 17, of the sample holder 5 is inserted between upper and lower magnetic pole pieces of the objective lens 6.

Provided for the electron energy loss spectrometer 8 are a magnetic field sector 10, a drift tube 20, multipole lenses 11 and 12, and a two-dimensional detector 13. The spectrometer can perform a spectroscopic analysis based on an electron energy loss spectroscopic method and a two-dimensional element analysis. The configuration of transmission electron microscope 1 and electron energy loss spectrometer 8 is not limited to the above but for example, the electron energy loss spectrometer 8 may be arranged inside the transmission electron microscope 1.

In the transmission electron microscope with electron energy loss spectrometer as shown in FIG. 1, the electron beam 3 emitted from the electron source 2 passes through the condenser lens 4 and is irradiated on the sample 17. An electron beam 3 having transmitted through the sample 17 passes through the objective lens 6 and the image forming lens system 7 having a plurality of lenses and when the fluorescent screen 9 is opened, directly enters the electron energy loss spectrometer 8. The entered electron beam 3 passes through units provided in the electron energy loss spectrometer 8, that is, the mulitpole lenses 11 and 12 used for electron energy loss spectroscopy and for focusing, enlargement, constriction and aberration correction of a transmission electron microscope image and an energy selective image as well and through the magnetic field sector 10 capable of performing spectroscopy in accordance with the amount of energy the electron beam 3 has and thereafter it is captured by such a two-dimensional detector 13 as CCD camera as a transmission electron microscope image, a two-dimensional element analysis image, a spectral image and the like which in turn are displayed on the image display unit 14.

The sample holder 5 is mounted with a sample 17 for electron microscopic observation. Also, the sample holder 5 is connected to an electrical measurement unit 15 and a fine movement control system 16 and after probes 24 provided inside the sample holder 5 have been moved to come in contact with the sample 17, electrical measurement of inward portions of the sample 17 is carried out.

Even when the transmission electron microscope 1 is not mounted with the electron energy loss spectrometer 8, a transmission electron microscopic image can be observed. In this case, the two-dimensional detector 13 is arranged directly below the fluorescent screen 9 of transmission electron microscope 1. The spectrometer mounted to the transmission electron microscope 1 is not limited to the electron energy loss spectrometer 8 but may be an energy dispersive X-ray detector, for instance.

Figure 2:
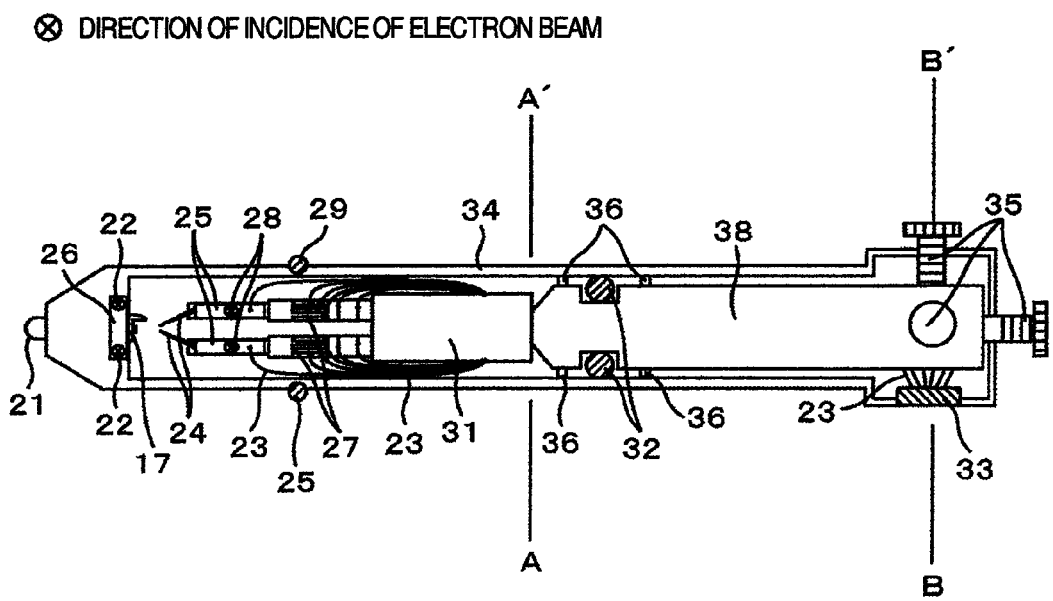
FIG. 2 is a diagram schematically showing an example of the construction of a sample holder.

Turning to FIG. 2, an example of the sample holder according to an embodiment of the invention is constructed as schematically illustrated in top diagram form as viewed in the direction of the electron source 2. In the present embodiment, the sample holder will be explained as being a transmission electron microscope side entry sample holder having two probes 24 arranged. The present transmission electron microscope sample holder is inserted into a high vacuum chamber of the transmission electron microscope from the flank thereof while being mounted with the probes 24. In the present embodiment, the arrangement of two probes 24 is exemplified but the number of probes 24 is not limited thereto.

In FIG. 2, the sample holder 5 has a body which includes a pivot 21, a sample holder cylinder 34, an external O ring 29, a sample clamp plate 26 and sample clamp screws 22. In order that high vacuum inside the transmission electron microscope can be maintained when the sample holder 5 is inserted exteriorly of the transmission electron microscope 1, the external O ring 29 is arranged on the outer surface of the sample holder cylinder 34. If a pivot receptacle is not provided inside the transmission electron microscope 1, the pivot 21 may be omitted.

The sample 17 to be observed with the electron microscope is located on the inner surface of the closed tip end of sample holder cylinder 34 and subsequently, the sample 17 is clamped by means of the sample clamp plate 26 and then, the sample clamp plate 26 is fixed by means of the sample clamp screws 22. When locating the sample 17 on the sample holder cylinder 34, the sample holder cylinder 34, sample clamp plate 26 and sample clamp screws 22 are electrically insulated from the sample holder 5.

The sample holder 5 includes fine movement mechanisms 27 for moving the probes 24, and a probe support 31. Attached to the probe support 31 are fine movement mechanisms 27 provided independently for the individual probes 24. Each of the arranged probes 24 is clamped by means of a probe clamp plate 25 and thereafter fixedly secured by means of a probe clamp screws 28. It is sufficient that the sample 17 and probe 24 be fixedly mounted inside the sample holder 5, and the aforementioned fixing method is in no way limitative.

In the present embodiment, the probes 24 are associated with the separate fine movement mechanisms 27, respectively, and the individual probes are permitted to move independently. For example, a piezoelectric device utilizing the piezoelectric effect is used for the fine movement mechanism 27 to enable the probe to move freely in three axial directions inclusive of the specimen holder insertion direction.

Provided that the probes 24 can move independently of each other, the fine movement mechanism 27 can be integral with the probe support 31.

Wiring 23 connected to the probe clamp plate 25 and fine movement mechanism 27 extends through the interior of probe support 31 and that of a driver 38 and connects to the electrical measurement unit 15 and fine movement control system 16 by way of a connector 33, thus ensuring that electrical measurement of an arbitrary portion of the sample 17 and movement of the probe 24 by the fine movement mechanism 27 can be carried out.

If a sample movement (drift) or the like is caused by wiring used for connection from the connector 33 to the electrical measurement unit 15 and fine movement control system 16, a signal processing based on a wireless system may be adopted.

The probe support 31 is connected to the driver 38. When the driver 38 is moved by means of rough movement mechanisms 35, the probe support 31 is also moved simultaneously. As the probe support 31 moves, the plural fine movement mechanisms 27 move simultaneously, that is, the plural probes 24 move simultaneously. For the rough movement mechanism 35, a micrometer head capable of being scanned manually or an externally controllable stepping motor is used.

By providing the rough movement mechanisms 35 and fine movement mechanisms 27 in this manner, the sample holder can be provided in which a rough movement mechanism need not be provided for each probe, succeeding in keeping the side of sample holder opposite to the sample location side weighted lightly and the plural probes can be moved independently.

While the fine movement mechanisms 27 are connected to the driver 38 by way of the probe support 31, this is not limitative and as long as the probes can move independently, the fine movement mechanism may be connected to the driver 38 without intervention of the probe support 31.

In order to keep the interior of sample holder 5 conditioned in vacuum, a sample holder inner O ring 32 is arranged between the sample holder cylinder 34 and the driver 38.

By separating the driver 38, the rough movement mechanism 35 and the fine movement mechanism 27 in this manner, the sample holder inner O ring 32 can be arranged at a position as close to the sample 17 as possible to reduce the volume of a space inside sample holder 5 to be evacuated to vacuum, so that when the sample holder 5 is inserted into the transmission electron microscope from the outside thereof, the time to pump to high vacuum can be shortened The driver 38 and probe support 31 are moved by means of the rough movement mechanism 35 but stoppers 36 are arranged in the direction of insertion of the sample holder and therefore, the sample holder inner O ring 32 can be stopped by the stoppers 36 to prevent the probe 24 from excessively approaching the sample 17. For movement in a direction orthogonal to the sample holder insertion direction, the sample holder inner O ring 32 expands/shrinks to eliminate a gap in association with the sample holder cylinder 34. Accordingly, the tip end of the sample holder 5 can always be kept in high vacuum.

Figure 3:
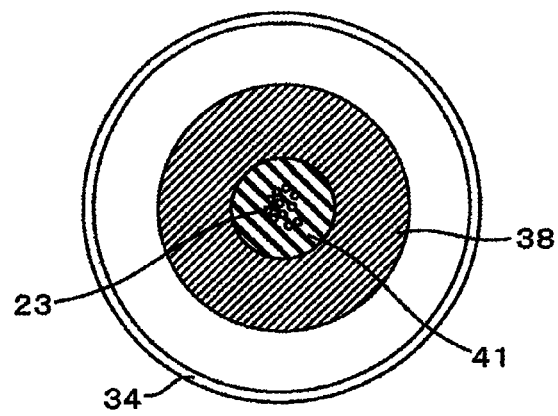
FIG. 3 is a cross-sectional diagram on line A-A' in FIG. 2.

A cross-section on line A-A' in FIG. 2 is illustrated in FIG. 3. The wiring 23 extends through a wiring passage hole 41 inside the driver 38 and connects to the connector 33 arranged near the rough movement mechanisms 35. After the wiring 23 has been laid, the wiring passage hole 41 is sealed with high-vacuum resistant bonder or cement. Since the wiring passage hole 41 is arranged more closely to the probe 24 than the sample holder inner O ring 32, the interior of the sample holder can be maintained at vacuum.

Figure 4:
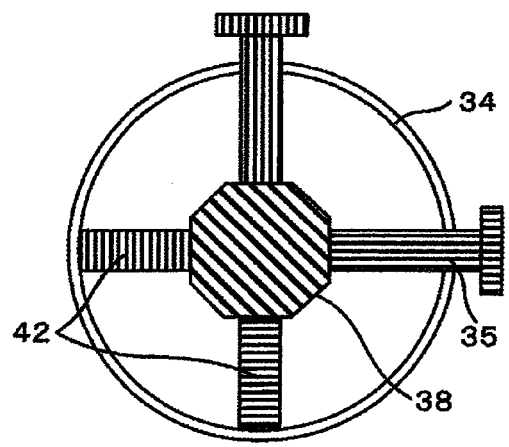
FIG. 4 is a cross-sectional diagram on line B-B' in FIG. 2.

A cross-section on line B-B' in FIG. 2 is illustrated in FIG. 4. The rough movement mechanisms 35 adjoin the driver 38 and on the side opposite to the rough movement mechanism 35, compression springs 42 are arranged with intervention of the driver 38. When the probe 24 is desired to be moved largely, the compressed spring 42 is compressed by moving the rough movement mechanism 35 manually to move the driver 38.

Figure 5:
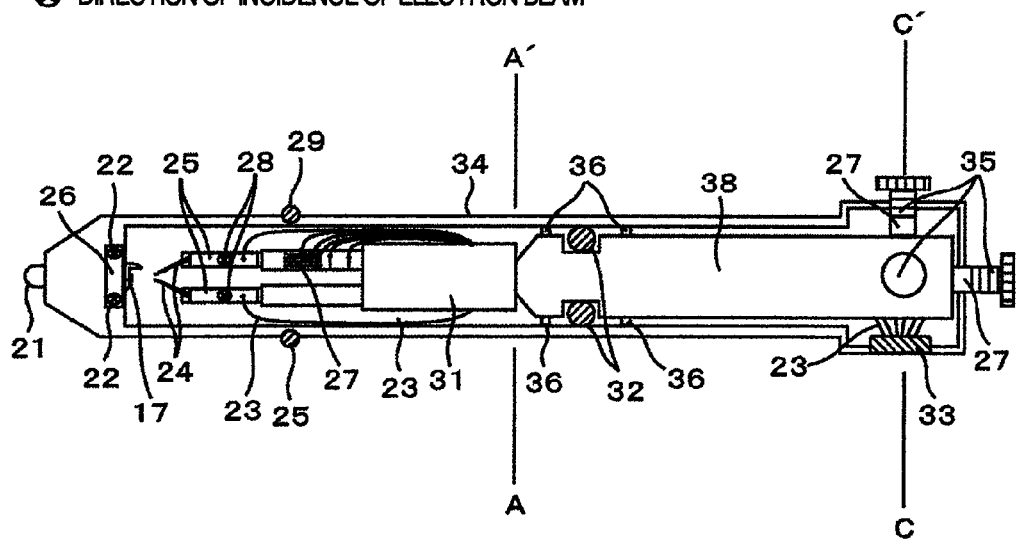
FIG. 5 is a diagram schematically showing another example of the construction of a sample holder.

Referring to FIG. 5, another example of the construction of sample holder according to the embodiment of the invention is schematically illustrated. As shown, two probes 24 are provided and part of the fine movement mechanism 27 is disposed externally of vacuum atmosphere.

Figure 6:
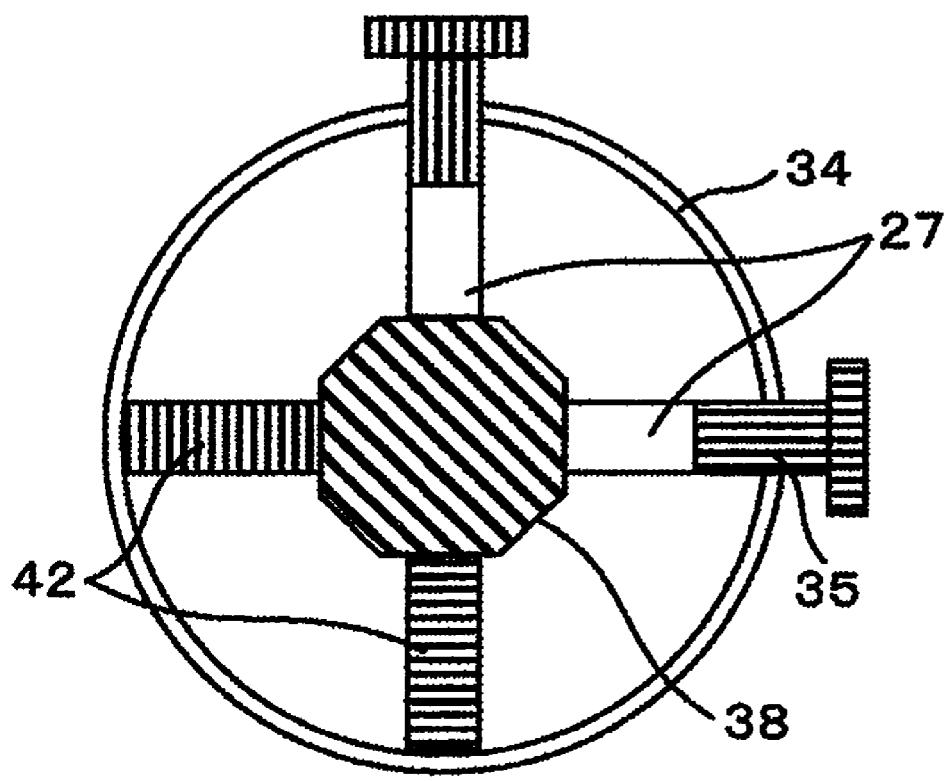
FIG. 6 is a cross-sectional diagram on line C-C' in FIG. 5.

When the number of probes 24 is two and the fine movement mechanisms 27 corresponding to the individual probes 24 are arranged in the sample holder 5, a great number of wiring conductors are laid in the high vacuum region of electron microscope. If the space inside the sample holder is limited and the fine movement mechanisms 27 for the individual probes 24 cannot be arranged in the high vacuum region, the fine movement mechanism 27 for either one probe may be arranged in the high vacuum region and the other fine movement mechanism 27 may be arranged between the rough movement mechanism 35 and the driver 38, as shown in FIG. 5. A cross-section on line C-C' in FIG. 5 is illustrated in FIG. 6. In the case of this arrangement, wiring conductors extending from the fine movement mechanism 27 arranged between the rough movement mechanism 35 and the driver 38 are all arranged exteriorly of the high vacuum atmosphere. The driver 38 can be moved in individual axial directions more finely by the fine movement mechanism 27 arranged between the rough movement mechanism 35 and the driver 38 than by the rough movement mechanism 35. In this manner, even when the fine movement mechanisms 27 are provided for not all of the plural probes 24, electrical measurement at an arbitrary position of the sample 17 can be achieved and at the same time, electron microscopic observation at the electrical measurement portion can also be achieved.

The probe 24 can be made of any electrically conducting materials and for example, tungsten, platinum iridium or platinum may be used. To make the tip end diameter of the probe 24 small, an electrolytic polishing process, a focused ion beam unit or an argon ion milling machine may be used.

In the foregoing description, the present invention is described as being applied exemplarily to the transmission electron microscope having the electron energy loss spectrometer but the invention is not limited to the application to only the above apparatus and can be applicable to all apparatus adopting the side entry system of inserting the sample from the side of the apparatus proper.

Enumerated as the apparatus employing the side entry system of inserting the sample from the side of the apparatus proper are, for example, the transmission electron microscope, the scanning electron microscope and the charged particle beam apparatus such as focused ion beam unit.

In the foregoing, the present invention made by the present inventors has been described specifically on the basis of embodiments but the invention is in no way limited to the foregoing embodiments and obviously, can be altered, changed and modified in various ways without departing from the gist of the invention.

The invention claimed is:

1. A sample holder of side-entry type capable of holding samples, comprising:
    a plurality of probes in contact with a sample;
    a plurality of fine movement mechanisms for moving said plural probes; and
    a driver connected to said fine movement mechanisms included inside of said sample holder of side-entry type, wherein:
    said plurality of fine movement mechanisms move said plural probes independently of one another and said driver moves said plural probes simultaneously, and
    an O ring contacting said driver and the inner wall of the sample holder is disposed to maintain vacuum in a region where said probes and said fine movement mechanisms are arranged.

2. A sample holder according to claim 1, wherein said fine movement mechanisms are provided for said plural probes, respectively, to move said probes independently of one another.

3. A sample holder according to claim 2, wherein said fine movement mechanism is constructed of a piezoelectric device.

4. A sample holder according to claim 1, wherein said probe is movable inside a charged particle beam apparatus.

5. A sample holder according to claim 1 further comprising a maintenance mechanism for maintaining vacuum in a region where said probes and said fine movement mechanisms are arranged.

6. A sample holder according to claim 1 further comprising a fine movement control system for controlling said fine movement mechanism.

7. A sample holder according to claim 1, wherein said probe is connected to an electrical measurement unit and brought into contact with an arbitrary inward positional portion of the sample in an electron microscope through movement by said driver and said fine movement mechanism, thereby ensuring that electrical measurement of the arbitrary inward portion of the electron microscopic sample can be achieved.

8. A sample holder according to claim 1, wherein said probe is movable in three axial directions inclusive of a direction of insertion of the sample holder.

9. A sample holder according to claim 1, wherein said sample holder is inserted into a charged particle beam apparatus and said sample can be observed inside said charged particle beam apparatus.

10. A sample holder of side-entry type capable of holding samples inside comprising:
    a plurality of probes in contact with a sample;
    a first fine movement mechanism for moving at least one of said plural probes independently of the other probes;
    a driver connected to said plurality of probes; and
    a second fine movement mechanism for moving said driver inside said sample holder,
    wherein said driver moves said plurality of probes simultaneously; and
    an O ring contacting said driver and the inner wall of the sample holder is disposed to maintain vacuum in a region where said probes and said first fine movement mechanism are arranged.

11. A charged particle beam apparatus comprising the sample holder of claim 1.

12. A sample holder according to claim 10, wherein said first fine movement mechanism is provided for at least one of said plural probes.

13. A sample holder according to claim 10, wherein each of said first and second fine movement mechanisms is constructed of a piezoelectric device.

14. A sample holder according to claim 10, wherein said probe is movable inside a charged particle beam apparatus.

15. A sample holder according to claim 10 further comprising a maintenance mechanism for maintaining vacuum in a region where said probes and said first fine movement mechanism are arranged.

16. A sample holder according to claim 10 further comprising a fine movement control system for controlling said first and second fine movement mechanisms.

17. A sample holder according to claim 10, wherein said probe is connected to an electrical measurement unit and brought into contact with an arbitrary inward positional portion of the sample in an electron microscope through movement by said driver and said first and second fine movement mechanisms, thereby ensuring that electrical measurement of the arbitrary inward portion of the electron microscopic sample can be achieved.

18. A sample holder according to claim 10, wherein said probe is movable in three axial directions inclusive of a direction of insertion of the sample holder.

19. A sample holder according to claim 10, wherein said sample holder is inserted into a charged particle beam apparatus and said sample can be observed inside said charged particle beam apparatus.

20. A charged particle beam apparatus comprising the sample holder of claim 10.

* * * * *